United States Patent
Chen et al.

(10) Patent No.: US 10,270,376 B2
(45) Date of Patent: Apr. 23, 2019

(54) FAN DRIVING CIRCUIT

(71) Applicant: ANPEC ELECTRONICS CORPORATION, Hsinchu (TW)

(72) Inventors: Kun-Min Chen, Hsinchu (TW); Che-Ming Hsu, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/663,665

(22) Filed: Jul. 28, 2017

(65) Prior Publication Data
US 2018/0241329 A1 Aug. 23, 2018

(30) Foreign Application Priority Data

Feb. 20, 2017 (TW) .............................. 106105587 A

(51) Int. Cl.
| | |
|---|---|
| H02P 6/08 | (2016.01) |
| H02P 7/29 | (2016.01) |
| H02P 6/20 | (2016.01) |
| H02P 6/28 | (2016.01) |
| H03K 17/0814 | (2006.01) |
| H02P 29/02 | (2016.01) |
| H02H 3/00 | (2006.01) |
| H02P 6/17 | (2016.01) |

(52) U.S. Cl.
CPC ................. H02P 7/29 (2013.01); H02H 3/00 (2013.01); H02P 6/08 (2013.01); H02P 6/17 (2016.02); H02P 6/20 (2013.01); H02P 6/28 (2016.02); H02P 29/02 (2013.01); H03K 17/08146 (2013.01)

(58) Field of Classification Search
CPC .... H02P 7/291; H02P 3/14; H02P 6/18; H02P 6/085; H02P 7/29
USPC .......................................... 318/461, 811, 599
See application file for complete search history.

(56) References Cited

U.S. PATENT DOCUMENTS

| | | | | |
|---|---|---|---|---|
| 7,301,294 | B2 * | 11/2007 | Ogino ........................ | H02P 6/17 318/400.03 |
| 8,299,735 | B2 * | 10/2012 | Horng ........................ | H02P 7/29 318/362 |
| 8,395,343 | B2 * | 3/2013 | Tsai .......................... | G06F 1/20 318/599 |
| 8,441,243 | B2 * | 5/2013 | Chen ........................ | H02M 1/08 323/282 |
| 2004/0251863 | A1 * | 12/2004 | Hahn ...................... | H02P 6/085 318/434 |

(Continued)

*Primary Examiner* — Rina I Duda
(74) *Attorney, Agent, or Firm* — Li & Cai Intellectual Property (USA) Office

(57) ABSTRACT

A fan driving circuit includes a processing module providing a fan phase signal and a speed signal providing module electrically connected to the processing module and including a first switch having a first terminal, a second terminal receiving the fan phase signal and a third terminal electrically connected to a ground voltage, a second switch having a first terminal electrically connected to a speed signal providing terminal of the fan driving circuit and a first terminal of a first impedance, a second terminal electrically connected to a second terminal of the first impedance and a terminal of a diode, and a third terminal electrically connected to the first terminal of the first switch, and a third switch having a terminal electrically connected to a bias voltage.

15 Claims, 4 Drawing Sheets

(56) References Cited

U.S. PATENT DOCUMENTS

| | | | | |
|---|---|---|---|---|
| 2004/0263103 A1* | 12/2004 | Weisser | ............... | H02P 6/085 |
| | | | | 318/400.29 |
| 2008/0116752 A1* | 5/2008 | Kuroda | ............ | G07C 9/00309 |
| | | | | 307/125 |
| 2011/0062910 A1* | 3/2011 | Tsai | ....................... | H02P 6/18 |
| | | | | 318/400.35 |
| 2013/0307458 A1* | 11/2013 | Tsai | .................. | H02P 7/2913 |
| | | | | 318/504 |

* cited by examiner

FAN DRIVING CIRCUIT

BACKGROUND

1. Technical Field

The present disclosure relates to a fan driving circuit, in particular, to a fan driving circuit that does not get damaged in a reversed connection state.

2. Description of Related Art

The current fan drive circuit has a speed providing terminal (FG terminal), and the main purpose of disposing the speed providing terminal is that the fan speed can be observed when the fan is activated. However, when the speed providing terminal is electrically connected to the grounding voltage and the grounding terminal is electrically connected to a DC voltage, a huge current is generated through a body diode of the MOSFET inside the speed providing terminal. Therefore, the MOSFET inside the speed providing terminal would suffer damage.

Therefore, providing a fan driving circuit that is unsusceptible to damage in a reversed connection state has become an important issue in the industry.

SUMMARY

In order to achieve the above purposes, a fan driving circuit is provided in the present disclosure. The fan driving circuit is configured for driving a fan, wherein the fan driving circuit includes at least one driving terminal and a speed signal providing terminal. The fan driving circuit includes a processing module providing a fan phase signal; a speed signal providing module electrically connected to the processing module, the speed signal providing module including: a first diode including a first terminal and a second terminal; a first impedance including a first terminal and a second terminal; a first switch including a first terminal, a second terminal and a third terminal, wherein the third terminal of the first switch is electrically connected to a ground voltage, the second terminal of the first switch receives the fan phase signal; a second switch including a first terminal, a second terminal and a third terminal, wherein the first terminal of the second switch is electrically connected to the speed signal providing terminal of the fan driving circuit and the first terminal of the first impedance, the second terminal of the second switch is electrically connected to the second terminal of the first impedance and the second terminal of the first diode, the third terminal of the second switch is electrically connected to the first terminal of the first switch; and a third switch including a first terminal, a second terminal and a third terminal, wherein the first terminal of the third switch is electrically connected to a DC voltage source, the second terminal of the third switch is electrically connected to a bias voltage, the third terminal of the third switch is electrically connected to the first terminal of the first diode.

In order to achieve the above purposes, a fan driving circuit for driving a fan is provided in the present disclosure. The fan driving circuit includes at least one driving terminal and a speed signal providing terminal. The fan driving circuit includes: a processing module providing a fan phase signal; a speed signal providing module electrically connected to the processing module, the speed signal providing module including: a first diode including a first terminal and a second terminal; a first impedance including a first terminal and a second terminal; a first switch including a first terminal, a second terminal and a third terminal, wherein the third terminal of the first switch is electrically connected to a ground voltage, the second terminal of the first switch is used for receiving the fan phase signal; a second switch including a first terminal, a second terminal and a third terminal, wherein the first terminal of the second switch is electrically connected to the speed signal providing terminal of the fan driving circuit and the first terminal of the first impedance, the second terminal of the second switch is electrically connected to the second terminal of the first impedance and the second terminal of the first diode, the third terminal of the second switch is electrically connected to the first terminal of the first switch; and a current source electrically connected to the first terminal of the first diode; wherein when a ground terminal of the fan driving circuit is electrically connected to a high level voltage and the speed signal providing terminal of the fan driving circuit is electrically connected to a ground voltage, the current source does not operate.

The speed signal providing module of the fan driving circuit of the present disclosure is implemented with a first switch, a third switch (or a current source), a first impedance, and a first diode. When the fan driving circuit is in a normal state or in a reversed connection state, the first switch does not suffer damage.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the present disclosure.

DESCRIPTION OF THE EXEMPLARY EMBODIMENTS

Figure 1:
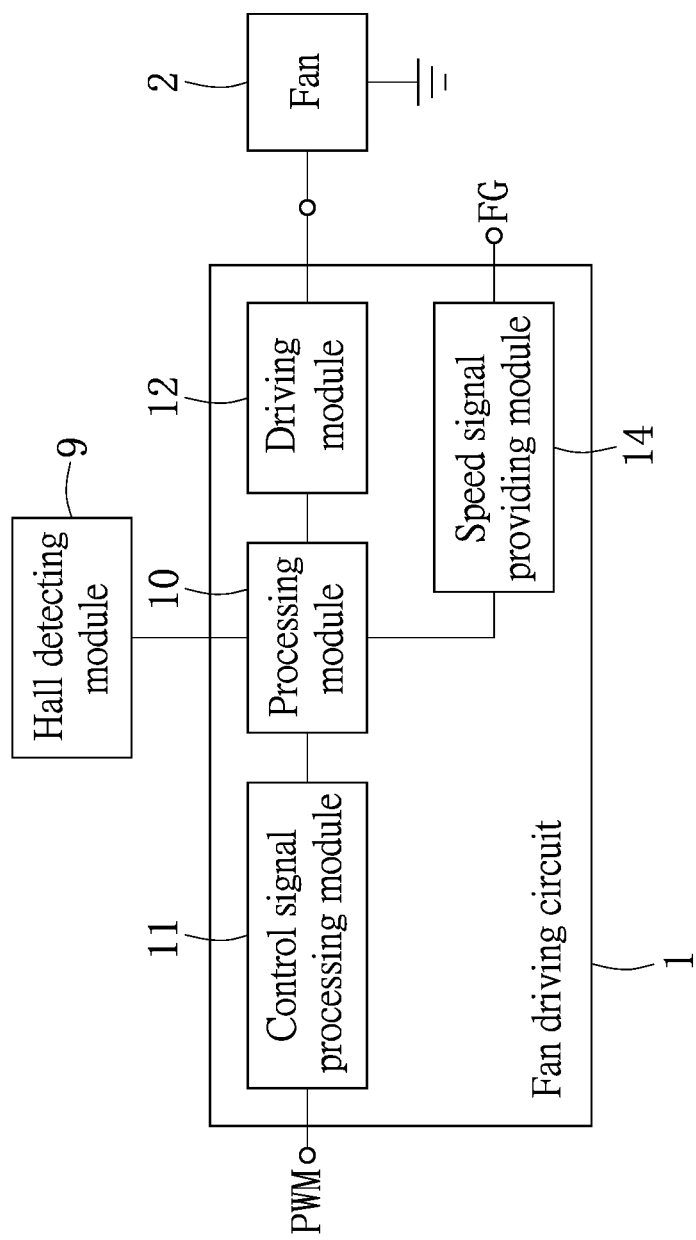
FIG. 1 is a schematic diagram of a fan driving circuit according to an embodiment of the present disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

[The Embodiment of the Fan Driving Circuit]

Figure 2:
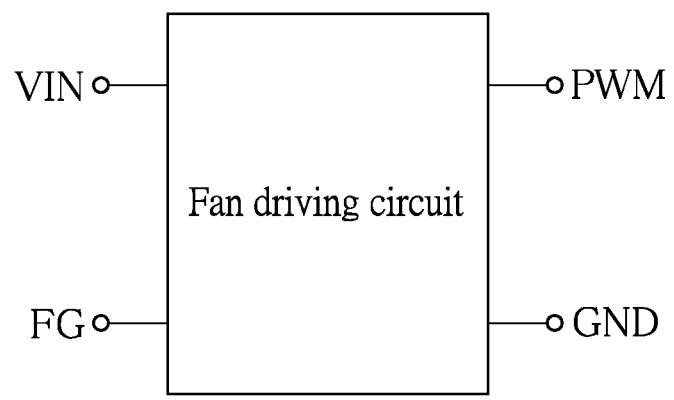
FIG. 2 is a schematic diagram illustrating the terminal assignment of the fan driving circuit according to an embodiment of the present disclosure.

Referring to FIG. 1 and FIG. 2, FIG. 1 is a schematic diagram of a fan driving circuit according to an embodiment of the present disclosure, and FIG. 2 is a schematic diagram illustrating the terminal assignment of the fan driving circuit according to an embodiment of the present disclosure.

A fan driving circuit 1 includes a processing module 10, a control signal processing module 11, a driving module 12 and a speed signal providing module 14.

In the embodiment, the control signal processing module 11, the driving module 12 and the speed signal providing module 14 are electrically connected to the processing module 10.

In the embodiment, the control signal providing module 11 is electrically connected to a pulse width modulation terminal PWM. The driving module is electrically connected to at least one driving terminal (not shown). The control signal providing module 14 is electrically connected to a speed signal proving terminal FG. In the embodiment, the fan driving circuit further includes an input voltage VIN electrically connected to a DC voltage (not shown), and a grounding terminal GND electrically connected to a grounding voltage (not shown).

The control signal processing module 11 receives a fan control signal of a control circuit (not shown) through the pulse width modulation signal terminal PWM and transforms the fan control signal into a processing signal. The control signal processing module 11 transmits the processing signal to the processing module 10. The processing module 10 provides a plurality of control signals to the driving module 12 according to the processing signal of the control signal processing module 11.

The driving module 12 provides a plurality of fan driving signals to drive the fan 2 according to the control signals of the processing module 10. In the embodiment, the driving module 12 is an H-bridge circuit, a bridge circuit, or a three-phase bridge circuit. The bridge circuit includes four MOSFETs or BJTs. In the embodiment, the driving module is a driving circuit for a single phase motor. In other embodiments, the driving module 12 can be a driving circuit for two-phase motor or a driving circuit for three-phase motor, and the present disclosure is not limited thereto. In addition, in the embodiment, the driving module 12 is electrically connected to the driving terminal of the fan driving circuit 1 to transmit the fan driving signal. In other embodiments, the driving module 12 can be electrically connected to multiple terminals for transmitting signals to drive the fan 2, and the present disclosure is not limited thereto.

The speed signal providing module 14 is configured for generating a speed signal corresponding to the phase difference based on an external hall detecting module 9. In the embodiment, the speed signal providing module 14 is electrically connected to a speed signal providing terminal FG of the fan driving circuit 1. The speed signal corresponding to the phase difference is transmitted to the control circuit (not shown) through the speed signal providing terminal FG. In other embodiments, the hall detecting module 9 can be built in the fan driving circuit 1, and the present disclosure is not limited thereto.

Figure 3:
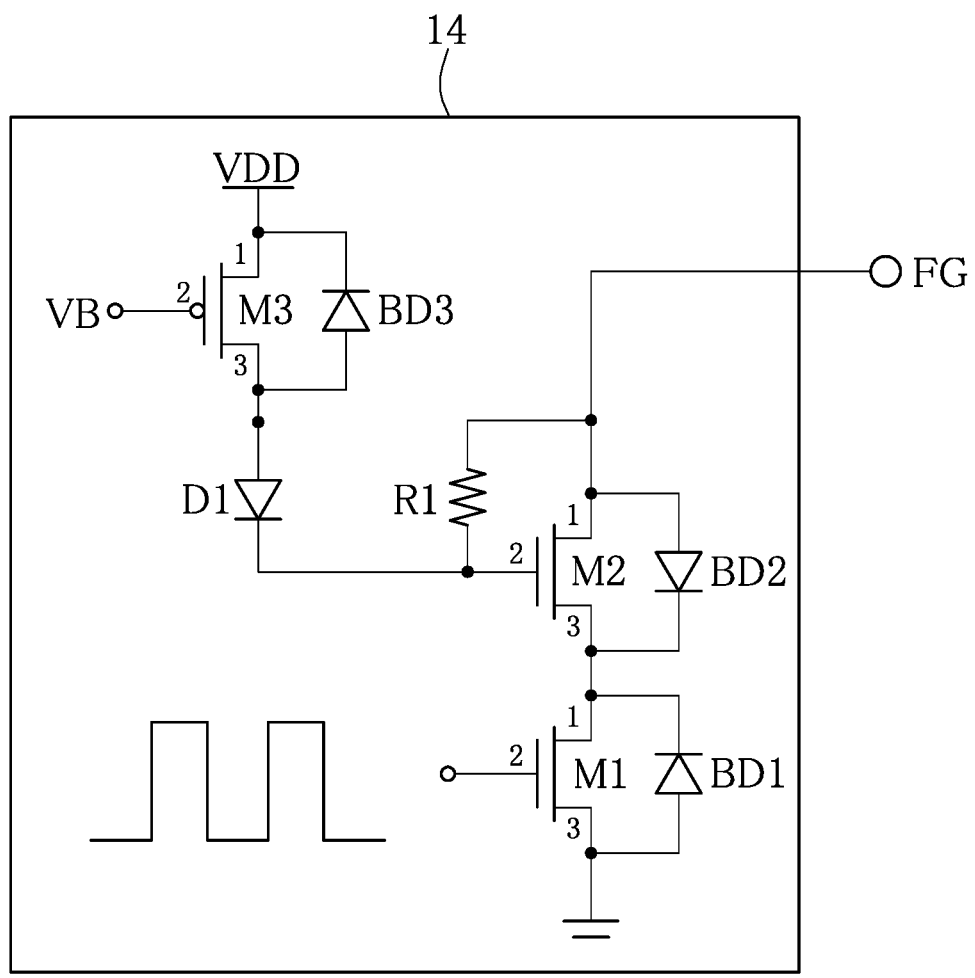
FIG. 3 is a schematic diagram of a speed signal providing module according to an embodiment of the present disclosure.

Referring to FIG. 3, FIG. 3 is a schematic diagram of a speed signal providing module according to an embodiment of the present disclosure.

The speed signal providing module 14 includes a first switch M1, a second switch M2, a third switch M3, a first impedance R1 and a first diode D1. The first switch M1, the second switch M2 and the third switch M3 has a first body diode BD1, a second diode BD2 and a third diode BD3, respectively.

In the embodiment, the first switch M1 includes a first terminal, a second terminal, and a third terminal. The second switch M2 includes a first terminal, a second terminal, and a third terminal. The third switch M3 includes a first terminal, a second terminal, and a third terminal. The first terminal of the first switch M1 is electrically connected to the third terminal of the second switch M2. The second terminal of the first switch M1 is used to electrically connect to a phase signal transmitted from the processing module 10. The first switch M1 is turned on or turned off according to the phase signal to transmit a speed signal through the first terminal thereof.

The first terminal of the second switch M2 is electrically connected to the speed signal providing terminal FG and the first terminal of the first impedance R1, and the second terminal of the second switch M2 is electrically connected to the second terminal of the first diode D1 (cathode terminal). The first terminal of the third switch M3 is electrically connected to a DC voltage source VDD. The second terminal of the third switch M3 is electrically connected to a bias voltage VB. The third terminal of the third switch M3 is electrically connected to the first terminal (anode terminal) of the first diode D1. In the embodiment, when the fan driving circuit 1 is in the normal operation state, the bias voltage VB is provided to the second terminal of the third switch M3 for turning on the third switch M3. The first switch M1 is turned on or turned off to generate a speed signal according to the phase signal. The speed signal is transmitted through the first terminal of the second switch M2 and the speed signal providing terminal FG of the fan driving circuit 1. In the embodiment, the first impedance R1 is a resister to which the present disclosure is not limited. In addition, the type of the first diode D1 is not limited in the present disclosure.

Specifically, the speed signal providing terminal FG is electrically connected to an external pull high voltage (e.g.: 12V DC voltage). For preventing the external voltage of the speed signal terminal providing terminal FG from being higher than the DC voltage source VDD and a current path between the speed signal providing terminal and the DC voltage VDD in the fan driving circuit 1 causing the fan driving circuit 1 and the external circuit suffering damage, the first diode D1 is provided between the third terminal of the third switch M3 and the second terminal of the second switch M2 for blocking the current between the speed providing terminal and the DC voltage VDD. In addition, a voltage drop can be reduced according to an external pull-high voltage of the speed providing terminal FG through the internal current path.

In the embodiment, the first switch M1 and the third switch M3 are P-type metal oxide semiconductor field effect transistors. The second switch M2 is an N-type metal oxide semiconductor field effect transistor.

In the embodiment, an ESD component can be provided between the third terminal of the third switch M3 and the grounding voltage. Namely, the ESD component is provided between the third terminal of the third switch M3, the first diode D1 and the grounding voltage. In addition, an ESD component is provided between the DC voltage source VDD and the grounding voltage. The ESD component is provided between the speed signal providing terminal FD and the grounding voltage. An ESD component can be provided between the third terminal of the second switch M2 and first terminal of the first switch. M1 and the grounding voltage. The ESD components can be provided according to practical requirements, and the present disclosure is not limited thereto.

Figure 4:
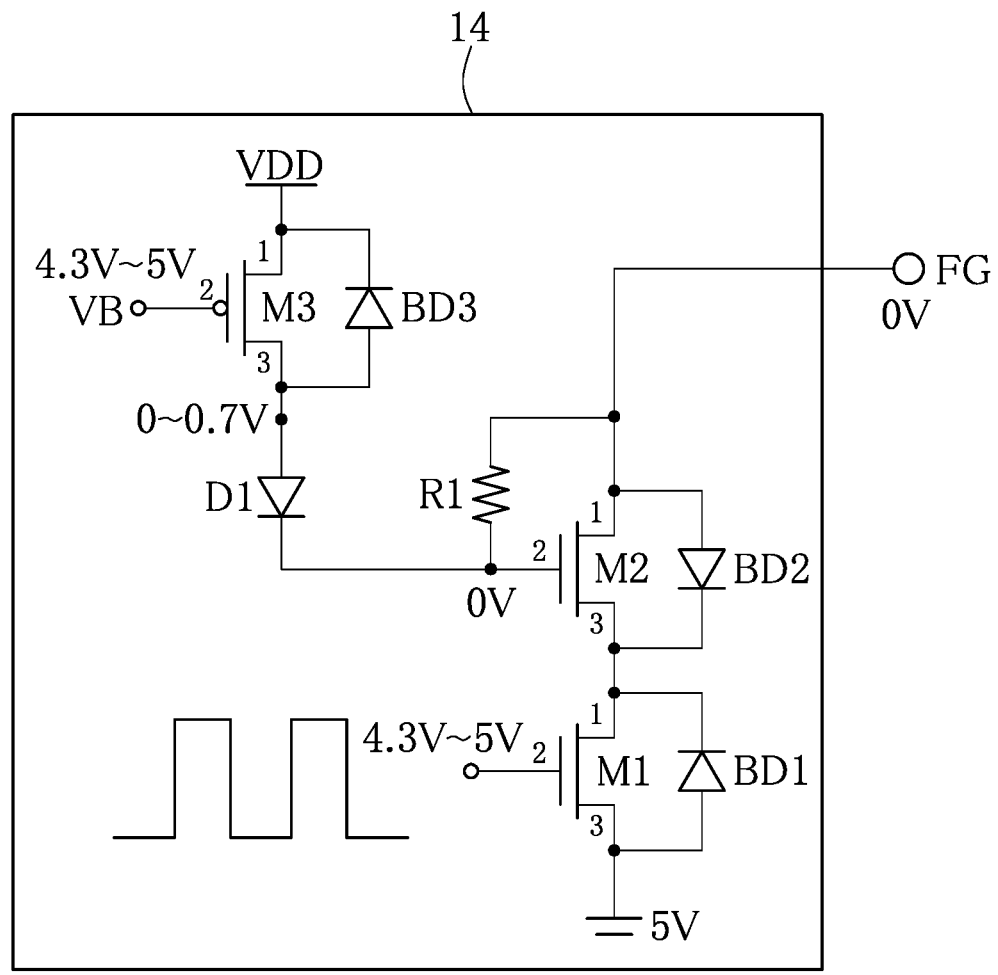
FIG. 4 is a schematic diagram of the speed signal providing module in a reversed connection according to an embodiment of the present disclosure

Referring to FIG. 4, FIG. 4 is a schematic diagram of the speed signal providing module in a reversed connection according to an embodiment of the present disclosure.

In the embodiment, the reversed connection state of the fan driving circuit 1 is that the speed signal providing terminal FG is connected to a grounding voltage (0V) and the grounding terminal (not shown) is connected to a DC voltage source VDD. In the embodiment, the DC voltage source is 5V. The voltage as shown in the FIG. 3 is the voltage of each node of the fan driving circuit 1 in the reversed connection state.

The voltage of the second terminal of the third switch M3 is 4.7V. The third terminal of the third switch M3 is 0V-0.7V. In the embodiment, the third switch M3 is a P-type metal oxide semiconductor field effect transistor. When the voltage difference of the first terminal and the second terminal of the third switch M3 is smaller than a threshold, the third switch M3 is turned on. The threshold is 0.5V-1V. When the fan driving circuit 1 is in the reversed connection state, the voltage difference of the first terminal and the second terminal of the third switch M3 is larger than the threshold. Accordingly, the third switch M3 is not turned on when the fan driving circuit 1 is in the reversed state. The first terminal of the second switch M2 is electrically connected to 0V when the fan driving circuit 1 is in the reversed connection state, in which the first terminal of the second switch M2 is electrically connected to the speed signal providing terminal FG. The voltage of the second terminal of the second switch M2 is 0V, in which the second terminal of the second switch M2 is connected to the first terminal of the second switch M2 through the first impedance R1. Therefore, the second switch M2 is not tuned on. When the fan driving circuit 1 is in the reversed connection state, the first diode D1 can block the DC voltage VDD and the driving signal of the second switch M2 for preventing the second switch M2 from being in the operation state.

Whether the first switch M1 is in the operation state or not, the first terminal of the first switch M1 is electrically connected to the second switch M2 that is turned off and the second body diode BD 2 of the second switch M2 blocks the DC voltage VDD, such that the DC voltage VDD does not pass through the first body diode BD1 of the first switch M1 and the second body diode BD2 of the second switch M2 to generate a huge current when the fan driving circuit 1 is in a reversed connection state. Accordingly, the first switch is not damaged.

The speed signal providing module of the fan driving circuit of the present disclosure is implemented with a first switch, a third switch (or a current source), a first impedance, and a first diode. When the fan driving circuit is in a normal state or in a reversed connection state, the first switch does not suffer damage.

The above-mentioned descriptions represent merely the exemplary embodiments of the instant disclosure, without any intention to limit the scope of the instant disclosure thereto. Various equivalent changes, alterations or modifications based on the claims of present disclosure are all consequently viewed as being embraced by the scope of the instant disclosure.

What is claimed is:

1. A fan driving circuit, configured for driving a fan, wherein the fan driving circuit includes at least one driving terminal and a speed signal providing terminal, the fan driving circuit comprising:
    a processing module providing a fan phase signal; and
    a speed signal providing module electrically connected to the processing module, the speed signal providing module including:
        a first diode including a first terminal and a second terminal;
        a first impedance including a first terminal and a second terminal;
        a first switch including a first terminal, a second terminal and a third terminal, wherein the third terminal of the first switch is electrically connected to a ground voltage, and the second terminal of the first switch receives the fan phase signal;
        a second switch including a first terminal, a second terminal and a third terminal, wherein the first terminal of the second switch is electrically connected to the speed signal providing terminal of the fan driving circuit and the first terminal of the first impedance, the second terminal of the second switch is electrically connected to the second terminal of the first impedance and the second terminal of the first diode, and the third terminal of the second switch is electrically connected to the first terminal of the first switch; and
        a third switch including a first terminal, a second terminal and a third terminal, wherein the first terminal of the third switch is electrically connected to a DC voltage source, the second terminal of the third switch is electrically connected to a bias voltage, and the third terminal of the third switch is electrically connected to the first terminal of the first diode.

2. The fan driving circuit of claim 1, further comprising:
    a control signal processing module electrically connected to a pulse width modulation signal terminal for receiving a pulse width modulation signal.

3. The fan driving circuit of claim 2, further comprising:
    a driving module electrically connected to the processing module and the driving terminal of the fan driving circuit, and the processing module controlling the driving module to provide a fan driving signal for driving the fan.

4. The fan driving circuit of claim 1, further comprising:
    a hall detecting module used for detecting a phase difference of the fan.

5. The fan driving circuit of claim 1, wherein the first switch and the third switch are P-type Metal-Oxide-Semiconductor Field-Effect Transistors.

6. The fan driving circuit of claim 1, wherein the second switch is a P-type Metal-Oxide-Semiconductor Field-Effect Transistor.

7. The fan driving circuit of claim 1, wherein a ground terminal of the fan driving circuit is electrically connected to a high level voltage source, and the speed signal providing terminal of the fan driving circuit is electrically connected to a ground voltage; when a voltage difference between the first terminal of the third switch and the second terminal of the third switch is larger than a threshold voltage, the third switch does not operate.

8. A fan driving circuit for driving a fan, wherein the fan driving circuit includes at least one driving terminal and a speed signal providing terminal, the fan driving circuit comprising:
    a processing module providing a fan phase signal; and
    a speed signal providing module electrically connected to the processing module, the speed signal providing module including:
        a first diode including a first terminal and a second terminal;
        a first impedance including a first terminal and a second terminal;
        a first switch including a first terminal, a second terminal and a third terminal, wherein the third terminal of the first switch is electrically connected to a ground voltage, and the second terminal of the first switch is used for receiving the fan phase signal;
        a second switch including a first terminal, a second terminal and a third terminal, wherein the first terminal of the second switch is electrically connected to the speed signal providing terminal of the fan driving circuit and the first terminal of the first impedance, the second terminal of the second switch is electrically connected to the second terminal of the first impedance and the second terminal of the first diode, and the third terminal of the second switch is electrically connected to the first terminal of the first switch; and
a current source electrically connected to the first terminal of the first diode;
wherein when a ground terminal of the fan driving circuit is electrically connected to a high level voltage and the speed signal providing terminal of the fan driving circuit is electrically connected to a ground voltage, the current source does not operate.

9. The fan driving circuit of claim 8, wherein the current source comprises:
a third switch including a first terminal, a second terminal and a third terminal, wherein the first terminal of the third switch is electrically connected to a DC voltage source, the second terminal of the third switch is electrically connected to a bias voltage, and the third terminal of the third switch is electrically connected to the first terminal of the first diode.

10. The fan driving circuit of claim 8, further comprising:
a control signal processing module electrically connected to a pulse width modulation signal terminal for receiving a pulse width modulation signal.

11. The fan driving circuit of claim 10, further comprising:
a driving module electrically connected to the processing module and the driving terminal of the fan driving circuit, and the processing module controlling the driving module to provide a fan driving signal for driving the fan.

12. The fan driving circuit of claim 9, wherein the ground terminal of the fan driving circuit is electrically connected to a high level voltage source, the speed signal providing terminal of the fan driving circuit is electrically connected to the ground voltage, and when a voltage difference between the first terminal of the third switch and the second terminal of the third switch is larger than a threshold voltage, the third switch does not operate.

13. The fan driving circuit of claim 8, wherein the first switch is a P-type Metal-Oxide-Semiconductor Field-Effect Transistor.

14. The fan driving circuit of claim 8, wherein the second switch is an N-type Metal-Oxide-Semiconductor Field-Effect Transistor.

15. The fan driving circuit of claim 9, wherein the third switch is a P-type Metal-Oxide-Semiconductor Field-Effect Transistor.

* * * * *